United States Patent
Benz et al.

(10) Patent No.: US 9,819,331 B2
(45) Date of Patent: Nov. 14, 2017

(54) FAST PRE-STATION LIST REPRESENTATION IN A SINGLE FM TUNER SYSTEM

(71) Applicant: Harman Becker Automotive Systems GmbH, Karlsbad (DE)

(72) Inventors: Christoph Benz, Ohlsbach (DE); Philipp Schmauderer, Hoefen (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 14/952,330

(22) Filed: Nov. 25, 2015

(65) Prior Publication Data
US 2016/0156338 A1   Jun. 2, 2016

(30) Foreign Application Priority Data
Dec. 1, 2014   (EP) ..................................... 14195622

(51) Int. Cl.
*H04B 1/16*   (2006.01)
*H03J 1/04*   (2006.01)
(Continued)

(52) U.S. Cl.
CPC ............ *H03J 1/045* (2013.01); *H04B 1/1653* (2013.01); *H04H 60/372* (2013.01);
(Continued)

(58) Field of Classification Search
CPC .......... H04B 1/16; H04B 1/18; H04B 1/1653; H04H 20/08; H04H 20/26; H04H 60/44;
(Continued)

(56) References Cited

U.S. PATENT DOCUMENTS

2009/0131003 A1* 5/2009 Masamoto ............. H04H 20/08
                                                     455/186.1
2009/0325522 A1* 12/2009 Konno ................... H04H 20/26
                                                     455/182.2
2010/0291861 A1* 11/2010 Anzures ................. H04H 20/26
                                                     455/3.01

FOREIGN PATENT DOCUMENTS

DE       19502360 C1    3/1996
EP        0429000 A2    5/1991
WO     2012120334 A1    9/2012

OTHER PUBLICATIONS

European Committee for Electrotechnical Standardization, "Specification of the Radio Data System (RDS) for VHF/FM Sound Broadcasting in the Frequency Range from 87,5 to 108,0 MHz," European Standard No. EN50067, Apr. 1998, 132 pages.
(Continued)

*Primary Examiner* — Thanh Le
(74) *Attorney, Agent, or Firm* — McCoy Russell LLP (57) ABSTRACT

Embodiments are disclosed of methods and systems for providing information in a single FM tuner system. An example method according to the disclosure provides station information in a single FM tuner system, and comprises receiving radio data system (RDS) data/radio broadcast data system (RBDS) data by the single FM tuner system; extracting frequency information regarding receivable stations from the received RDS/RBDS data and displaying a list of the receivable frequencies; extracting additional information regarding the receivable stations from the received RDS/RBDS data, and displaying the extracted additional information regarding the receivable stations in correspondence with the respective receivable frequencies in the list. Further a single FM tuner system is provided for carrying out the method.

14 Claims, 3 Drawing Sheets

(51) Int. Cl.
*H04H 60/43* (2008.01)
*H04H 60/44* (2008.01)
*H04H 60/37* (2008.01)

(52) U.S. Cl.
CPC ............ *H04H 60/43* (2013.01); *H04H 60/44* (2013.01); *H04H 2201/13* (2013.01)

(58) Field of Classification Search
CPC ...... H04H 60/372; H04H 60/43; H04H 60/27; H04H 60/46; H04H 2201/13; H03J 1/045
See application file for complete search history.

(56) References Cited

OTHER PUBLICATIONS

European Patent Office, Extended European Search Report Issued in Application No. 14195622.7, dated Feb. 4, 2015, 6 pages.

\* cited by examiner

FIG. 1

| | | | | |
|---|---|---|---|---|
| Pop: | | | | |
| | German | Baden-Württemberg | | 98,4 MHz |
| | French | National | | 95,0 MHz |
| News: | | | | |
| | German | Saarland | | 98,2 MHz |
| | French | National | | 93,0 MHz |
| Classic: | | | | |
| | German | National | | 92,4 MHz |
| | German | Rheinland-Pfalz | | 92,8 MHz |

FIG. 2A

| | | | | |
|---|---|---|---|---|
| German | Baden-Württemberg | P1 | Pop | 93,5 MHz |
| German | Baden-Württemberg | P4 | Pop | 98,4 MHz |
| German | Baden-Württemberg | Reg | Pop | 104,9 MHz |
| German | Rheinland-Pfalz | P2 | Classic | 96,2 MHz |
| German | Rheinland-Pfalz | P3 | Pop | 93,5 MHz |
| German | Saarland | P3 | Pop | 95,5 MHz |
| French | National | | | 87,8 MHz |
| French | National | | | 93,3 MHz |

FAST PRE-STATION LIST REPRESENTATION IN A SINGLE FM TUNER SYSTEM

CROSS REFERENCE TO RELATED APPLICATIONS

The present application claims priority to European Patent Application No. EP14195622.7, entitled "FAST PRE-STATION LIST REPRESENTATION IN A SINGLE FM TUNER SYSTEM," and filed on Dec. 1, 2014, the entire contents of which are hereby incorporated by reference for all purposes.

FIELD

The present disclosure relates to a method of providing station information in a single FM tuner system.

BACKGROUND

The Radio Data System (RDS) is a communications protocol standard for including small amounts of digital information in conventional FM radio broadcasts. RDS standardizes several types of information that is transmitted, including time, station identification, and program information. The Radio Broadcast Data System (RBDS) is the official name used for the U.S. version of RDS. The two standards differ only slightly. Both carry data at about 1187 bits per second on a 57-kHz subcarrier, so there are exactly 48 cycles of subcarrier during every data bit. The Radio Data System (RDS) is an information broadcast that was introduced for use in FM radio stations which transmit stereo-multiplex signals in the VHF frequency band. The Radio Data System provides radio receivers with broadcast data about the transmitting radio station and the programs broadcast by the radio station. The radio receivers typically reproduce this data on an optical display such as a liquid-crystal display screen.

The RDS broadcast data may include program identification (PI) which indicates the program being received or the name of the station/transmitter tuned in; program type identification (PTY) which indicates the type of program such as music, news, etc.; traffic announcements (TA); and/or radio text (RT) which contains program-accompanying information such as the music title, performer, program changes, and the like. The Radio Data System is used principally in car radios. For example, when the reception of the transmitter currently tuned in deteriorates, RDS-capable car radios automatically switch over to a better, or best receivable, transmitter broadcasting the same program. The information required to do this includes the noted program identification (PI) information along with a list of alternative frequencies (AF) which are being broadcast by RDS-capable radio stations. The Radio Data System also offers advantages to the listener of home FM receivers as well. For example, the home listener can benefit from the noted program type identification (PTY) and radio text (RT) information.

The RDS specification EN 50067:1998 defines a number of RDS group types that are generally reserved for a particular application. The type 0A group—basic tuning and switching information—is a special case, designed to carry the fundamental components of RDS all together in a single group that will be transmitted frequently to convey many pieces of information to an RDS receiver to enable it to perform a considerable number of tuning functions. These fundamental components, known as features, allow a degree of automatic tuning in an RDS receiver and allow it to present tuning-related information to the user. The type 0A group contains all of the following RDS features: Alternative Frequency (AF), Decoder Information (DI), Music Speech (MS), PI, Program Type (PTY), Traffic Announcement (TA), and Traffic program (TP). The type 0B group contains the same features except the AF feature. The implementation of the type 0 groups in any RDS transmission is essential, and not optional—unlike many of the other possible groups in RDS—because it carries vital information required for automated tuning of an RDS receiver. From these basic RDS features serving as tuning aids, it is useful to consider AF, PI, PS, and TP. They can be seen in various locations within the type 0A group. Furthermore, PI and TP can be found in all other groups to provide immediate information to an RDS receiver from every single group decoded. The type 0B group has a very similar structure, but there is a simple difference in block 3. In block 3, the AF feature is not used, so it is replaced by a second PI code. This group is normally used by single-service RDS transmissions, where there is no need for an AF list because there are, indeed, no alternates.

The following information fields are normally contained in the RDS data:

AF (alternative frequencies): This allows a receiver to re-tune to a different frequency providing the same station when the first signal becomes too weak (e.g., when moving out of range). This is often utilized in car stereo systems.

CT (clock time): Can synchronize a clock in the receiver or the main clock in a car. Due to transmission vagaries, CT can only be accurate to within 100 ms of UTC.

EON (enhanced other networks): Allows the receiver to monitor other networks or stations for traffic programs, and automatically temporarily tune into that station.

PI (program identification): This is the unique code that identifies the station. Every station receives a specific code with a country prefix. In the US, PI is determined by applying a formula to the station's call sign.

The PI code consists of 16 bits and is usually referred to by four hexadecimal characters, or nibbles. The PI code uniquely identifies a program service, within any geographical area, where broadcasts sharing the same PI code are guaranteed to be carrying identical program audio. Although there are many designs possible for an RDS receiver, evaluation of the PI code is fundamental to operation. In any receiver with preset memories, it is useful for the PI code of the broadcast to be stored in non-volatile memory when a service is assigned to a memory location. If no signal with the correct PI code is available, on the last tuned frequency or AFs, when a preset is chosen, the receiver may scan the FM band, stop on each receivable RDS service, and evaluate the PI code.

PS (program service): The Program Service Name contains maximally 8 alphanumeric characters. It can be used to inform the user about the station ID. The PS may be displayed by an RDS enabled tuner. As an addition to the static PS it is possible to use a dynamic PS (scrolling PS). Scrolling PS means that texts such as song title and artist or longer station names may also be displayed on non-radio text enabled receivers. The Program Service Name is transmitted in the groups 0A and 0B. According to the RDS standard, the PS has to be a static display and must not contain other text than an 8 digit name.

A total of four type 0A groups are required to transmit the entire PS name and therefore four type 0A groups will be required per second. The repetition rate of the type 0A group may be reduced if more capacity is needed for other applications. A minimum of two type 0A groups per second may be used to ensure correct functioning of PS and AF features. However, with EON receivers, search tuning is affected by the repetition rate of type 0 groups (TP/TA). It is to be understood that in this case, transmission of the complete PS will take 2 seconds. However, under typical reception conditions the introduction of errors may cause the receiver to take 4 seconds or more to acquire the PS name for display.

PTY (program type): This coding of up to 31 pre-defined program types (e.g., in Europe: PTY1 News, PTY6 Drama, PTY11 Rock music) allows users to find similar programming by genre. A tuner can use the PTY to receive specific program types only. Additionally the code can be used for station searching. The PTY code is transmitted in every RDS group. A tuner can use the PTY to receive specific program types only. Additionally the code can be used for station searching. The PTY code is transmitted in every RDS group.

The groups consist of four blocks, each being 26 bits long. These groups thus consist of 104 bits. One block consists of a 16-bit long information word and a 10-bit CRC check word to which is added an offset word that creates a synchronization mechanism. The RDS coding is structured so that the messages repeated most frequently (and which need a short acquisition time) normally occupy the same fixed positions within a group. This allows decoding without reference to any block outside that contain the information. In this example, the first block of each group always contains the PI code, whereas the PTY code and the TP flag occupy fixed positions in block 2 of every group. The group type code is specified by a 4-bit code that defines the group type (from 0 to 15). This code is sent in the first four bits of the second block of every group. In addition, the fifth bit of this block defines the "version" (A or B) of the group type. In version A groups, the PI code is inserted in block 1 only. In version B, the PI code is inserted in blocks 1 and 3.

REG (regional): This is mainly used in countries where national broadcasters run region-specific programs. This functionality allows the user to choose the set to their current region or let the radio tune into other region-specific programs as they move into the other region.

RT (radio text): This function allows a radio station to transmit a 64-character free-form text that can be either static (such as station slogans) or in synchronization with the program (such as the title and artist of the currently playing song).

TA, TP (traffic announcement, traffic program): The receiver can often be set to pay special attention to this flag and, for example, stop the tape/pause the CD or retune to receive a traffic bulletin. The TP flag is used to allow the user to find only those stations that regularly broadcast traffic bulletins whereas the TA flag is used to signal an actual traffic bulletin in progress, with radio units perhaps performing other actions such as stopping a cassette tape (so the radio can be heard) or raising the volume during the traffic bulletin.

TMC (traffic message channel): Digitally encoded traffic information. Not all RDS equipment supports this, but it is often available for automotive navigation systems. In many countries only encrypted traffic data is broadcast, and so an appropriate decoder, possibly related to a subscription service, is required to use the traffic data.

A station list may include the PS name (visible to the user) and some hidden information. To obtain a complete PS name a lot of RDS groups may be received because the single elements (two patterns) are transmitted sequentially in RDS group 0 every second (as recommended by the RDS specification). Therefore, a minimum time to receive a PS name may be 4 seconds (if good reception is assumed). In a single FM tuner it is difficult to get the PS name for another station than the foreground station (the station that is actually listened to by the user), because the system has to be muted too long, which severely degrades the listening comfort for the user.

SUMMARY

The problem underlying the present disclosure is to provide the user with more information with less degradation of comfort than other tuner systems. The above-mentioned problem is solved by the method according to claim 1, in one example. An example method according to the disclosure provides station information in a single FM tuner system, and comprises the steps of: receiving radio data system (RDS) data and/or radio broadcast data system (RBDS) data by the single FM tuner system; extracting frequency information regarding receivable stations from the received RDS/RBDS data and displaying a list of the receivable frequencies, wherein the list in particular includes one or more receivable frequencies; extracting additional information regarding the receivable stations from the received RDS/RBDS data, and displaying the extracted additional information regarding the receivable stations in correspondence with the respective receivable frequencies in the list.

Accordingly, a list with receivable frequencies may be provided to a user by displaying a list. The disclosure provides a possibility to fill this frequency list with more information, in order to give the user a better overview of the program to be expected behind these different frequencies. The example method according to the disclosure may be developed in that the extracting of additional information may comprise extracting information from the program type (PTY) information field of the RDS/RBDS data. The method offers the possibility to display PTY information related to the program type to the user.

In a further development, the extracted information from the PTY information field may comprise a PTY code, and the method may comprise the further step of assigning a first clear text to the PTY code and the step of displaying may comprise displaying the first clear text. Accordingly, an extracted PTY code such as "11" may be displayed to the user as "Rock music" in Europe (as "Oldies" in the U.S.), for example.

According to another development the extracting of additional information comprises extracting information from the program identification (PI) information field of the RDS/RBDS data. This offers the possibility to display PI information related to the program identification to the user.

In a further development, the extracted information from the PI information field may comprise a PI code, and the method may further comprise assigning a second clear text to the PI code and the displaying may further comprise displaying the second clear text. Accordingly, an extracted PI code such as "F202" may be displayed to the user as "French National," for example.

According to another development the first clear text may be assigned to the PTY code and/or the second clear text may be assigned to the PI code by using an assignment table that is stored in a database of the single FM tuner system. This is a convenient way of converting the respective code to clear text that can be displayed to a user.

The method according to the disclosure or one of the developments may further comprise selecting a station based on the additional information by a user of the single FM tuner system. Thus, the user may select a station in consideration of the frequency and in consideration of the PI and or PTY information, in particular when this information is converted to clear text and displayed.

This method may further comprise replacing the additional information with the program service name (PS name) of the selected station when the corresponding PI code has been received.

The disclosure also provides a single FM tuner system according to claim 9. An example single FM tuner system according to the disclosure comprises: a receiver for receiving radio data system (RDS) data and/or radio broadcast data system (RBDS) data; a display for displaying information; a processor for extracting frequency information regarding receivable stations from the received RDS/RBDS data and for sending display data to the display for displaying a list of the receivable frequencies on the display, wherein the list in particular includes one or more receivable frequencies; wherein the processor is further configured for extracting additional information regarding the receivable stations from the received RDS/RBDS data, wherein the display data further comprise data corresponding to the extracted additional information regarding the receivable stations; and the display is further configured to display the extracted additional information in correspondence with the respective receivable frequencies in the list.

The advantages of the single FM tuner according to the disclosure and the developments described in the following correspond to the advantages of the method according to the disclosure and the related developments thereof. Therefore, reference is made to the advantages already described above.

According to a development of the single FM tuner system the extracted additional information may comprise information from the program type (PTY) information field of the RDS/RBDS data.

In particular, the extracted information from the PTY information field may comprise a PTY code, and the processor may be further configured to assign a first clear text to the PTY code and the display may be further configured to display the first clear text.

According to another development of the single FM tuner system the extracted additional information may comprise information from the program identification (PI) information field of the RDS/RBDS data.

In particular, the extracted information from the PI information field may comprise a PI code, and the processor may be further configured to assign a second clear text to the PI code and the display may be further configured to display the second clear text.

In a further development the single FM tuner may further comprise a database for storing an assignment table for assigning the first clear text to the PTY code and/or the second clear text to the PI code.

In another development the single FM tuner may further comprising selection means for selecting a station by a user of the single FM tuner system based on the additional information.

Further features and advantages of the present disclosure will be described in the following with reference to the figures, which illustrate only examples of embodiments of the present disclosure. The illustrated and described features may be suitably combined with each other.

DETAILED DESCRIPTION

RDS data may be formatted in groups. For example, there may be 16 groups, divided into type A and type B. These groups may include different data, such as PTY or EON data. A group may be formatted as follows. The group may include 104 bits and may be divided into 4 blocks. A block may include 26 bits and may be divided into the Information Word and the Check word with the Offset. The Information Word may include 16 bits and carry data. The Check word with the Offset is for error correction and synchronization.

Block 1 of each group includes the PI code of the station. Block 2 includes the following data: Group Type Code (identifies the present transmitted group); Version Flag (identifies the group as type A or type B); TP Flag; PTY; 5 group individual bits; Block 3 and 4 contain group specific data.

There are A and B groups. Different to A groups, B groups always contain the PI code in the 3rd Block. If a radio station e.g., has no alternative frequencies, it can send the group 0B instead of 0A. This means that the PI code is transmitted again for better synchronization instead of transmitting alternative frequencies.

The PTY codes may be transmitted, using five bits in block 2 of every single RDS group. Additionally, the type 15B group (providing fast basic tuning and switching information) carries a second opportunity for decoding the PTY code, which is also transmitted in block 4. Furthermore, the code may also be carried in type 14A groups, variant 13 from transmissions cross-referencing a program service. The PTY codes for Europe are given in the RDS specification EN 50067: 1998. These codes provide standardized descriptions for broadcasters to depict their programs according to a short list of 29 standardized choices.

The Program Identification (PI) code may include 16 bits. Bits b15 to b12 make up the country/area symbol (hex code). Code assignments b11 to b0 are assigned in each country or area in such a way that for example bits b11 to b8 describe the program type in terms of area coverage, and bits b7 to b0 are a program reference number. Codes may be assigned in such a way that automatic search tuning to other transmitters radiating the same program can locate the same Program Identification Code; e.g., all 16 bits shall be identical. The PI code may be transmitted in block 1 of every single RDS group. PI is a machine-readable code that is not intended for direct display. It is uniquely allocated to each individual program service within a geographical area to enable it to be distinguished from all other program services. Irrespective of frequencies used, transmissions with identical PI codes in any given area must have the identical audio program. A receiver may therefore freely switch between two different transmissions with the same PI code in order to track optimum reception, assured that program audio will be identical on both transmitters. One important application of the information contained in the PI code is to enable an RDS receiver to automatically search for an alternative frequency in case of bad reception of the program to which the receiver is tuned; the criteria for the changeover to the new frequency would be the presence of a better signal having the same PI code.

Figure 1:
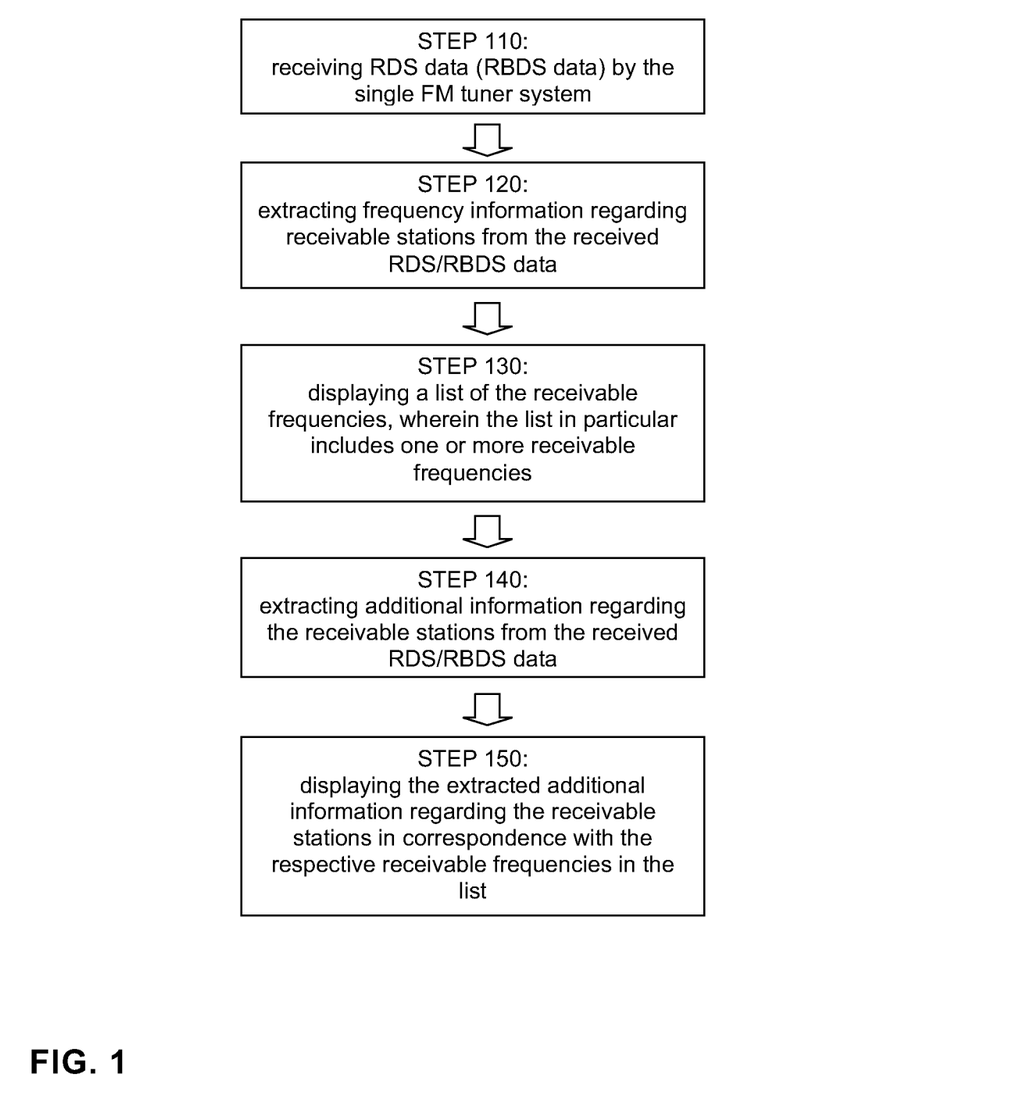
FIG. 1 illustrates an example embodiment of a method of providing information according to the disclosure.

FIG. 1 shows an embodiment of the method according to the disclosure. The method according to the disclosure provides station information in a single FM tuner system, and comprises the following steps: STEP 110: receiving radio data system, RDS, data/radio broadcast data system, RBDS, data by the single FM tuner system; STEP 120: extracting frequency information regarding receivable stations from the received RDS/RBDS data; STEP 130: displaying a list of the receivable frequencies, wherein the list in particular includes one or more receivable frequencies; STEP 140: extracting additional information regarding the receivable stations from the received RDS/RBDS data; and STEP 150: displaying the extracted additional information regarding the receivable stations in correspondence with the respective receivable frequencies in the list.

The conventional method provides a list with receivable frequencies. In fact, a short check of other frequencies is always necessary in single tuner systems. The disclosure provides a possibility to fill this frequency list with more information, in order to give the user a better overview of the program to be expected behind these different frequencies.

The basic idea according to the present disclosure is to show in addition to the frequencies of other stations some information of Block A and B of the RDS data, which is the PI code and the PTY code, which is updated every 87.6 milliseconds. For these information the system has to check the other frequencies longer than only for a quality check (lasts for about 5-10 ms), but it is much less than checking for the PS name. From the RDS specification it is evident that the country codes have multiple assignments. A clear association could be obtained by means of additional information as the Extended Country Code (EEC), which is transmitted in group 1A. But group 1A is only rarely transmitted, and therefore it cannot be reliably be used for short tests. However, a clear assignment can be obtained by performing an EEC plausibility check with the EEC determined of the actually heard station (foreground station). The check is performed by means of a stored database matrix. The assignment from coded information to clear text can be stored in a data base and can then be used to represent information in the station list that can be used by a user to meet a preselection to what kind of station he/she will tune.

The following table lists the RDS and RBDS program type (PTY) codes and their meanings

| PTY code | RDS program type (EU) | RBDS program type (North America) |
| --- | --- | --- |
| 0 | No program type or undefined | No program type or undefined |
| 1 | News | News |
| 2 | Current affairs | Information |
| 3 | Information | Sports |
| 4 | Sport | Talk |
| 5 | Education | Rock |
| 6 | Drama | Classic rock |
| 7 | Culture | Adult hits |
| 8 | Science | Soft rock |
| 9 | Varied | Top 40 |
| 10 | Pop music | Country |
| 11 | Rock music | Oldies |
| 12 | Easy listening | Soft |
| 13 | Light classical | Nostalgia |
| 14 | Serious classical | Jazz |
| 15 | Other music | Classical |
| 16 | Weather | Rhythm and blues |
| 17 | Finance | Soft rhythm and blues |
| 18 | Children's programs | Language |
| 19 | Social affairs | Religious music |
| 20 | Religion | Religious talk |
| 21 | Phone-in | Personality |
| 22 | Travel | Public |
| 23 | Leisure | College |
| 24 | Jazz music | Spanish talk |
| 25 | Country music | Spanish music |
| 26 | National music | Hip Hop |
| 27 | Oldies music | Unassigned |
| 28 | Folk music | Unassigned |
| 29 | Documentary | Weather |
| 30 | Alarm test | Emergency test |
| 31 | Alarm | Emergency |

The later RBDS standard did not attempt to match the original RDS identifications, therefore several identical radio formats were given different numbers, including jazz, weather, sports, and rock.

PI codes must be allocated so that two different stations do not transmit the same PI code in the same area. As a part of this allocation process, the first nibble (hexadecimal character) is a Country Identifier, signifying the country of the origin of the broadcast. The second nibble is hexadecimal character signifying the coverage area of the station. For example, the hexadecimal character 0 is identified with the area coverage code L=Local, i.e. a local program that is transmitted only via a single transmitter; the hexadecimal character 1 is identified with the area coverage code I=International, i.e. the same program is also transmitted in other countries; the hexadecimal character 2 is identified with the area coverage code N=National, i.e. the same program is transmitted throughout the country; the hexadecimal character 3 is identified with the area coverage code S=Supra-regional, i.e. the same program is transmitted throughout a large part of the country; and the hexadecimal characters 4 to F are identified respectively with the area coverage codes R1 to R12=Regional, i.e. the program available only in one location or region.

Figure 2A:
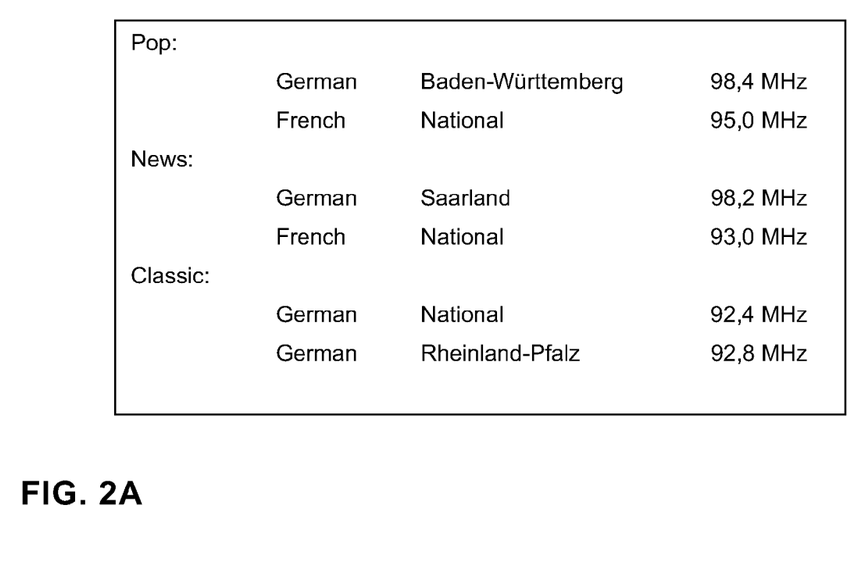
FIGS. 2A and 2B show examples of a station list.

FIG. 2A shows an example of station list that can be provided to a user in STEP 150 of the method described in FIG. 1.

The PTY code for the station at 98.4 MHz has been used to identify the program type as Pop and the first two nibbles of the PI code have been used to identify the Country as Germany and the Coverage Area as Baden-Württemberg, respectively. The PTY code for the station at 95.0 MHz has been used to identify the program type as Pop and the first two nibbles of the PI code have been used to identify the Country as France and the Coverage Area as National, respectively. The PTY code for the station at 98.2 MHz has been used to identify the program type as News and the first two nibbles of the PI code have been used to identify the Country as Germany and the Coverage Area as Saarland, respectively. The PTY code for the station at 93.0 MHz has been used to identify the program type as News and the first two nibbles of the PI code have been used to identify the Country as France and the Coverage Area as National, respectively. The PTY code for the station at 92.4 MHz has been used to identify the program type as Classic and the first two nibbles of the PI code have been used to identify the Country as Germany and the Coverage Area as National, respectively. The PTY code for the station at 92.8 MHz has been used to identify the program type as Classic and the first two nibbles of the PI code have been used to identify the Country as Germany and the Coverage Area as Rheinland-Pfalz, respectively.

The step of extracting additional information may comprise extracting information from the program type, PTY, information field of the RDS/RBDS data. The extracted information from the PTY information field may comprise a PTY code, and the method may comprise the further step of assigning a first clear text to the PTY code and the step of displaying may comprise displaying the first clear text. Accordingly, an extracted PTY code such as "1" may be displayed to the user as the first clear text "News", for example. The step of extracting additional information comprises extracting information from the program identification, PI, information field of the RDS/RBDS data.

The extracted information from the PI information field may comprise a PI code, and the method may comprise the further step of assigning a second clear text to the PI code and the step of displaying may comprise displaying the second clear text, such as "France and/or "National". The first clear text may be assigned to the PTY code and/or the second clear text may be assigned to the PI code by using an assignment table that is stored in a database of the single FM tuner system.

The user may select a station in consideration of the frequency and in consideration of the PI and or PTY information, in particular when this information is converted to clear text and displayed. If such a station is selected by the user and the correct PS name is eventually available, then the fast information can be replaced with the correct PS name.

Figure 2B:
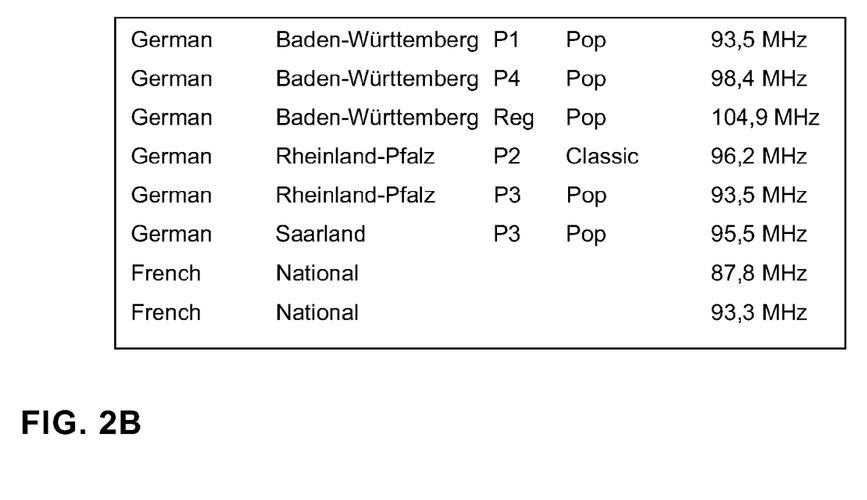

FIG. 2B shows another example of station list that can be provided to a user in STEP 150 of the method described in FIG. 1. In this example the list is sorted by country. Moreover, the additional information in the program reference number (bits b7 to b0, see above) is used at least for the supra-regional stations to indicate P1, P4, Reg, P2, P3, P3, in this specific example.

Figure 3:
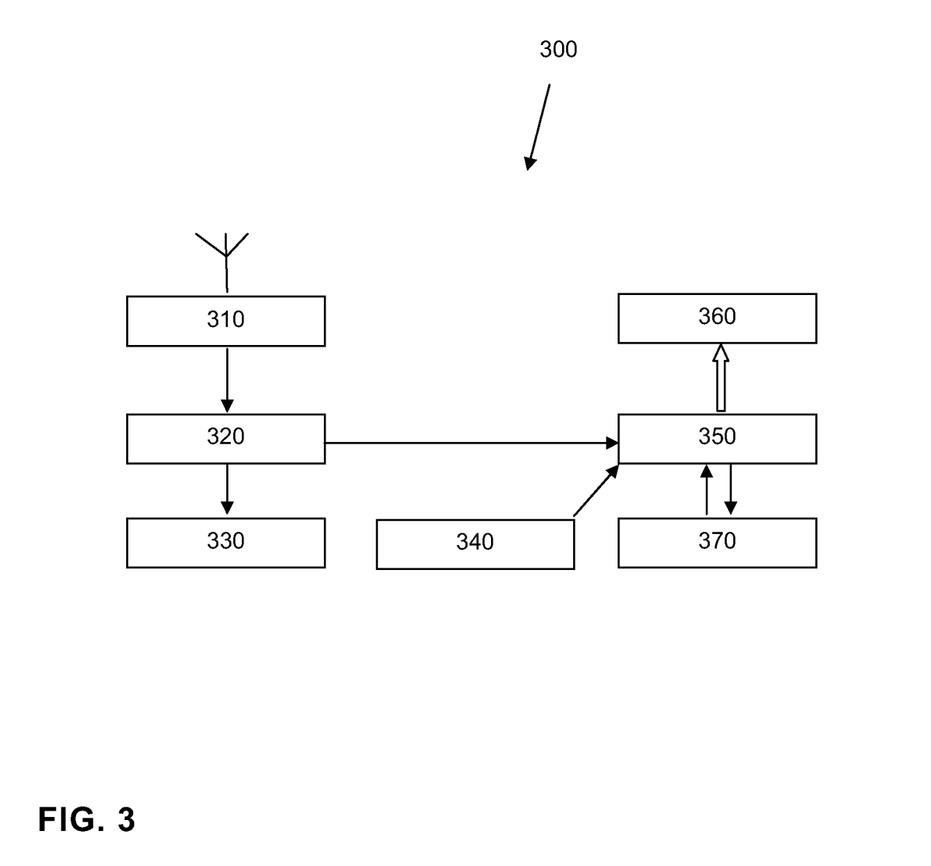
FIG. 3 illustrates an embodiment of a single FM tuner according to the disclosure.

FIG. 3 illustrates a single FM tuner system according to the disclosure. The single FM tuner system 300 in this embodiment comprises a receiver 310 for receiving audio data and for receiving radio data system, RDS, data/radio broadcast data system, RBDS, data; a display 360 for displaying information; and a multiplexer 320 for separating audio data from RDS data and for sending the audio data to an audio section 330 that provides the audio data to the user via speakers and for sending the RDS data to a processor 350. The single FM tuner system 300 further comprises the processor 350 for extracting frequency information regarding receivable stations from the received RDS/RBDS data and for sending display data to the display 360 for displaying a list of the receivable frequencies on the display 360, wherein the list in particular includes one or more receivable frequencies.

The processor 350 is further configured for extracting additional information regarding the receivable stations from the received RDS/RBDS data, wherein the display data further comprise data corresponding to the extracted additional information regarding the receivable stations; and the display 360 is further configured to display the extracted additional information in correspondence with the respective receivable frequencies in the list.

The single FM tuner according to this embodiment further comprises a database 370 for storing an assignment table for assigning the first clear text to the PTY code and/or the second clear text to the PI code. The single FM tuner system 300 further comprises selection means 370 for selecting a station by a user of the single FM tuner system based on the additional information. The selection means may be implemented as push buttons or as a touch screen, for example. However, also control via speech recognition may be used instead or in addition.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices, such as the FM tuner system 300 of FIG. 3. The methods may be performed by executing stored instructions with one or more logic devices (e.g., processors) in combination with one or more additional hardware elements, such as storage devices, memory, hardware network interfaces/antennas, switches, actuators, clock circuits, etc. The described methods and associated actions may also be performed in various orders in addition to the order described in this application, in parallel, and/or simultaneously. The described systems are exemplary in nature, and may include additional elements and/or omit elements. The subject matter of the present disclosure includes all novel and non-obvious combinations and sub-combinations of the various systems and configurations, and other features, functions, and/or properties disclosed.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The following claims particularly point out subject matter from the above disclosure that is regarded as novel and non-obvious.

The invention claimed is:

1. A method of providing station information in a single FM tuner system, the method comprising:
   receiving one or more of radio data system (RDS) data and radio broadcast data system (RBDS) data by the single FM tuner system;
   extracting frequency information regarding a plurality of receivable stations from the received RDS and/or RBDS data;
   extracting first additional information regarding the plurality of receivable stations from at least one of a program type (PTY) information field and a program identification (PI) information field of the received RDS and/or RBDS data, the first additional information being different from a program service (PS) name;
   displaying a list of the plurality of receivable stations based on the extracted frequency information and the extracted first additional information;
   selecting a station based on the first additional information by a user of the single FM tuner system;
   extracting second additional information comprising the PS name of the selected station when the corresponding RDS and/or RBDS data has been received; and
   updating the displayed list of the plurality of receivable stations based on the extracted second additional information by replacing the extracted first additional information with the PS name of the selected station.

2. The method of claim 1, wherein displaying the list of the plurality of receivable stations comprises displaying a list of a plurality of respective receivable frequencies and displaying the extracted first additional information regarding the plurality of receivable stations in correspondence with the plurality of respective receivable frequencies in the list.

3. The method of claim 2, wherein the extracted first additional information from the PTY information field comprises a PTY code, wherein the method further comprises assigning a first clear text to the PTY code, and wherein displaying the extracted first additional information further comprises displaying the first clear text.

4. The method of claim 3, wherein the extracted first additional information from the PI information field comprises a PI code, wherein the method further comprises assigning a second clear text PI code, and wherein displaying the extracted first additional information further comprises displaying the second clear text.

5. The method of claim 4, wherein the first clear text is assigned to the PTY code and/or the second clear text is assigned to the PI code using an assignment table stored in a database of the single FM tuner system.

6. A single FM tuner system, comprising:
a receiver for receiving one or more of radio data system (RDS) data and radio broadcast data system (RBDS) data;
a display for displaying information; and
a processor for extracting frequency information regarding a plurality of receivable stations from the received RDS and/or RBDS data;
wherein the processor is further configured for extracting first additional information regarding the plurality of receivable stations from at least one of a program type (PTY) information field and a program identification (PI) information field of the received RDS and/or RBDS data prior to extracting a program service (PS) name and for sending display data to the display for displaying a list of the plurality of receivable stations based on the extracted frequency information and the extracted first additional information, and
wherein the display is configured to display the list of the plurality of receivable stations, and
further comprising a selection mechanism for selecting a station by a user of the single FM tuner system based on the first additional information,
wherein the processor is further configured for extracting second additional information comprising the PS name of the selected station when the corresponding RDS and/or RBDS data has become available, and
sending updated display data to the display for displaying an updated list of the plurality of receivable stations based on the extracted second additional information by replacing the extracted first additional information with the PS name of the selected station.

7. The single FM tuner system according to claim 6, wherein displaying the list of the plurality of receivable stations comprises displaying a list of a plurality of respective receivable frequencies and displaying the extracted first additional information in correspondence with the plurality of respective receivable frequencies in the list.

8. The single FM tuner system according to claim 7, wherein the extracted first additional information from the PTY information field comprises a PTY code, and wherein the processor is further configured to assign a first clear text to the PTY code and the display is further configured to display the first clear text.

9. The single FM tuner system according to claim 8, wherein the extracted first additional information from the PI information field comprises a PI code, and wherein the processor is further configured to assign a second clear text to the PI code and the display is further configured to display the second clear text.

10. The single FM tuner system according to claim 9, further comprising a database for storing an assignment table for assigning the first clear text to the PTY code and/or the second clear text to the PI code.

11. A single FM tuner system, comprising:
a receiver for receiving one or more of radio data system (RDS) data and radio broadcast data system (RBDS) data;
a display device for displaying information;
a processor;
memory storing an assignment table for assigning coded information to associated clear text for presentation to a user, the memory further storing instructions executable by the processor to:
extract frequency information regarding a plurality of receivable stations from the received RDS and/or RBDS data,
extract first additional information regarding the plurality of receivable stations from at least one of a program type (PTY) information field and a program identification (PI) information field of the received RDS and/or RBDS data prior to extracting a program service (PS) name, the first additional information including coded information,
send display data to the display device for displaying a list of the plurality of receivable stations based on the extracted frequency information and the extracted first additional information, and
send instructions to control the display device to display the list of the plurality of receivable stations; and
a selection mechanism for selecting a station by a user of the single FM tuner system based on the extracted first additional information,
wherein the instructions are further executable to:
extract second additional information comprising the PS name of the selected station when the corresponding RDS and/or RBDS data is available, and
send updated display data to the display device for displaying an updated list of the plurality of receivable stations based on the extracted second additional information by replacing the extracted first additional information with the PS name of the selected station.

12. The single FM tuner system according to claim 11, wherein displaying the list of the plurality of receivable stations comprises displaying a list of a plurality of respective receivable frequencies and displaying the extracted first additional information in correspondence with the plurality of respective receivable frequencies in the list.

13. The single FM tuner system according to claim 12, wherein the extracted first additional information from the PTY information field comprises a PTY code, and wherein the instructions are further executable to assign a first clear text to the PTY code in the assignment table, and to send instructions to control the display device to display the first clear text.

14. The single FM tuner system according to claim 12, wherein the extracted first additional information from the PI information field comprises a PI code, and wherein the instructions are further executable to assign a second clear text to the PI code in the assignment table, and to send instructions to control the display device to display the second clear text.

\* \* \* \* \*